(12) United States Patent
Bosman et al.

(10) Patent No.: US 11,211,507 B2
(45) Date of Patent: Dec. 28, 2021

(54) METHOD FOR MANUFACTURING INTERCONNECTED SOLAR CELLS AND SUCH INTERCONNECTED SOLAR CELLS

(71) Applicants: STICHTING ENERGIEONDERZOEK CENTRUM NEDERLAND, Le Petten (NL); NEDERLANDSE ORGANISATIE VOOR TOEGEPAST— NATUURWETENSCHAPPELIJK ONDERZOEK TNO, DA 's-Gravenhage (NL)

(72) Inventors: Johan Bosman, Le Petten (NL); Anne Ferenc Karel Victor Biezemans, Le Petten (NL); Veronique Stephanie Gevaerts, Le Petten (NL); Nicola Debernardi, Da Eindhoven (NL)

(73) Assignees: STICHTING ENERGIEONDERZOEK CENTRUM NEDERLAND, Le Petten (NL); NEDERLANDSE ORGANISATIE VOOR TOEGEPAST- NATUURWETENSCHAPPELIJK ONDERZOEK TNO, 'S-Gravenhage (NL)

( * ) Notice: Subject to any disclaimer, the term of this patent is extended or adjusted under 35 U.S.C. 154(b) by 0 days.

(21) Appl. No.: 16/097,397

(22) PCT Filed: Apr. 26, 2017

(86) PCT No.: PCT/NL2017/050268
§ 371 (c)(1),
(2) Date: Oct. 29, 2018

(87) PCT Pub. No.: WO2017/188815
PCT Pub. Date: Nov. 2, 2017

(65) Prior Publication Data
US 2019/0157480 A1    May 23, 2019

(30) Foreign Application Priority Data
Apr. 29, 2016 (NL) ..................... 2016708

(51) Int. Cl.
*H01L 31/0463* (2014.01)
*H01L 31/0749* (2012.01)
(Continued)

(52) U.S. Cl.
CPC ...... *H01L 31/0463* (2014.12); *H01L 31/0256* (2013.01); *H01L 31/022466* (2013.01);
(Continued)

(58) Field of Classification Search
CPC ............. H01L 31/0463; H01L 31/0749; H01L 31/022466; H01L 31/0256; H01L 31/0392; H01L 31/03923; Y02E 10/541
See application file for complete search history.

(56) References Cited

U.S. PATENT DOCUMENTS

2006/0121701 A1\* 6/2006 Basol ................ H01L 21/02568
438/483
2006/0196536 A1\* 9/2006 Fujioka ................. H01L 31/046
136/244
(Continued)

FOREIGN PATENT DOCUMENTS

DE   10 2009 020 482 A1   11/2010
DE   10 2012 205 978 A1   10/2013
WO      2013/069267 A1    5/2013

OTHER PUBLICATIONS

Belghachi et al., "Effect of the absorber layer band-gap on CIGS solar cell", Chinese Journal of Physics 55 (2017) 1127-1134.\*
(Continued)

*Primary Examiner* — Golam Mowla
(74) *Attorney, Agent, or Firm* — Nixon & Vanderhye

(57) ABSTRACT

Disclosed is a method for making interconnected solar cells, including: a) providing a continuous layer stack on a sub-
(Continued)

strate, including a top electrode layer, a bottom electrode layer adjacent to the substrate, a photovoltaic active layer and a barrier layer adjacent to the bottom electrode layer between the top and bottom electrode layers; b) selectively removing the top electrode layer and the photo-voltaic layer for obtaining a first trench exposing the barrier layer using a first laser beam with a first wavelength; c) selectively removing the barrier layer and the bottom electrode layer within the first trench for obtaining a second trench exposing the substrate using a second laser beam with a second wavelength, d) filling the first trench and the second trench with electrical insulating member. The first wavelength of the first laser beam is larger than a wavelength corresponding with a bandgap energy of the photo-voltaic layer.

17 Claims, 3 Drawing Sheets

(51) Int. Cl.
  *H01L 31/0256* (2006.01)
  *H01L 31/0392* (2006.01)
  *H01L 31/0224* (2006.01)
(52) U.S. Cl.
  CPC .... *H01L 31/0392* (2013.01); *H01L 31/03923* (2013.01); *H01L 31/0749* (2013.01); *Y02E 10/541* (2013.01); *Y02P 70/50* (2015.11)

(56) References Cited

U.S. PATENT DOCUMENTS

| | | | |
|---|---|---|---|
| 2007/0079866 A1* | 4/2007 | Borden | H01L 31/046 |
| | | | 136/252 |
| 2008/0314439 A1 | 12/2008 | Misra | |
| 2010/0261307 A1* | 10/2010 | Wieting | H01L 31/046 |
| | | | 438/93 |
| 2012/0094425 A1* | 4/2012 | Ghandour | H01L 31/0749 |
| | | | 438/80 |
| 2012/0234366 A1 | 9/2012 | Lambertz et al. | |
| 2013/0171767 A1* | 7/2013 | Moslehi | H01L 31/1864 |
| | | | 438/89 |
| 2014/0273329 A1 | 9/2014 | Yang et al. | |
| 2015/0068580 A1 | 3/2015 | Probst | |
| 2015/0122314 A1* | 5/2015 | Snaith | H01L 51/4213 |
| | | | 136/255 |

OTHER PUBLICATIONS

Ergen et al., "Graded bandgap perovskite solar cells", Nature Materials, 2016, vol. 16, No. 5, DOI: 10.1038/NMAT4795.
International Search Report and Written Opinion, dated Aug. 3, 2017, from corresponding PCT application No. PCT/NL2017/050268.

* cited by examiner

METHOD FOR MANUFACTURING INTERCONNECTED SOLAR CELLS AND SUCH INTERCONNECTED SOLAR CELLS

FIELD OF THE INVENTION

The present invention relates to a method for manufacturing interconnected solar cells. Also, the invention relates to interconnected solar cells.

BACKGROUND OF THE INVENTION

From U.S. 2008 0314439 a process for manufacturing thin film solar cell panels is known. The process of forming an array of monolithically integrated thin film photovoltaic cells from a stack of thin film layers formed on an insulating substrate includes forming at least one cell isolation scribe in the stack of thin film layers. A second electrical contact layer isolation scribe is formed for each cell isolation scribe adjacent to a respective cell isolation scribe. A via scribe is formed in the stack of thin film layers between each cell isolation scribe and its respective second electrical contact layer isolation scribe. Insulating ink is disposed in each cell isolation scribe, and conductive ink is disposed in each via scribe to form a via. Conductive ink is also disposed along the top surface of the stack of thin film layers to form at least one conductive grid.

The main technical issue in conventional monolithic interconnected CIGS modules is the presence of shunting in a P1 scribe, due to the lateral conductivity of the CIGS material. The issue in backend interconnected CIGS modules using laser technology is the creation of shunts in a P3 scribe, which is mainly caused by melting behaviour of the material upon laser scribing. These shunts in P1 and P3 are limiting the efficiency that can be achieved by the solar cell modules.

Alternatively "conventional" P1, P2, P3 backend interconnection can be used, however more expensive picosecond lasers are needed for the creation of the P1, P2 and P3 scribes.

The object of the invention therefore is to provide a manufacturing method for enhancing the efficiency of interconnected solar cells and to provide such more efficient interconnected solar cells.

SUMMARY OF THE INVENTION

According to a first aspect, the invention provides a method in accordance with claim 1.

Advantageously, by applying the invention, shunt-free interconnections with a reduced dead zone width can be obtained.

In an embodiment, the method further comprises e) selectively removing the electrical insulating material and the portion of the barrier layer of the second solar cell inside the first trench for obtaining a third trench exposing the portion of the bottom electrode layer of the second solar cell inside the first trench using a third laser beam with a third wavelength; f) depositing an electrical interconnecting member covering at least a part of the third trench and connecting the top electrode layer of the first solar cell with the exposed portion of the bottom electrode layer of the second solar cell inside the first trench.

In an embodiment, the first wavelength is within a range between 1 μm and 3 μm. Advantageously, the approach of using such a laser enables the possibility of creating (optical) structures in the cells that can be used to make translucent modules. Also the creation of shunt-free vias for wrap through contact designs can be done using the combination of 2 μm wavelength and 0.532 μm (532 nm) wavelength lasers. The spot size of the 532 nm wavelength laser should be smaller than the spot size of the 2 μm wavelength laser to avoid any absorbance of the 532 nm light on the boundaries of the P3 scribe. For example, a 20 μm green spot of the second laser beam should have a gap with the P3 scribe wall of around 10 μm. A closer distance would generate phase changes in the adjacent CIGS layer.

In a further embodiment, the first laser beam has a pulsed period within a range between 0.25 ns and 100 ns. Advantageously, the approach of using such a nanosecond pulsed laser beam enables the possibility of creating (optical) structures in the cells that can be used to make translucent modules. Also the creation of shunt-free vias for wrap through approaches can be done using the combination of 2 μm wavelength and 0.532 μm wavelength nanosecond pulsed lasers. The spot size of the 532 nm wavelength laser should be smaller than the spot size of the 2 μm wavelength laser to avoid any absorbance of the 532 nm light on the boundaries of the P3 scribe.

According to another aspect, the invention provides interconnected solar cells, comprising a continuous layer stack on a substrate, the layer stack comprising a top electrode layer, a bottom electrode layer adjacent to the substrate, having a photo-voltaic active layer and a barrier layer adjacent to the bottom electrode layer interposed between the top and the bottom electrode layer; a first trench in the layer stack completely extending through the top electrode layer and the photo-voltaic layer exposing the barrier layer; a second trench inside the first trench through the bottom electrode layer exposing the substrate, wherein the second trench and the first trench are configured to provide a separation of the continuous layer stack for forming a first solar cell and a second solar cell, and have a portion of the barrier layer of the second solar cell inside the first trench and a portion of the bottom electrode layer of the second solar cell inside the first trench; an electrical insulating material filling the first trench and the second trench.

In an embodiment, the interconnected solar cells further comprise a third trench through the electrical insulating material and the portion of the barrier layer of the second solar cell inside the first trench exposing the portion of the bottom electrode layer of the second solar cell inside the first trench; an electrical interconnecting member covering at least a part of the third trench and connecting the top electrode layer of the first solar cell with the portion of the bottom electrode layer of the second solar cell inside the first trench.

Further embodiments are disclosed in the attached claims.

BRIEF DESCRIPTION OF THE DRAWINGS

Embodiments of the present invention will be described hereinafter, by way of example only, with reference to the accompanying drawings which are schematic in nature and therefore not necessarily drawn to scale. Furthermore, like reference signs in the drawings relate to like elements.

DETAILED DESCRIPTION

Figure 1:
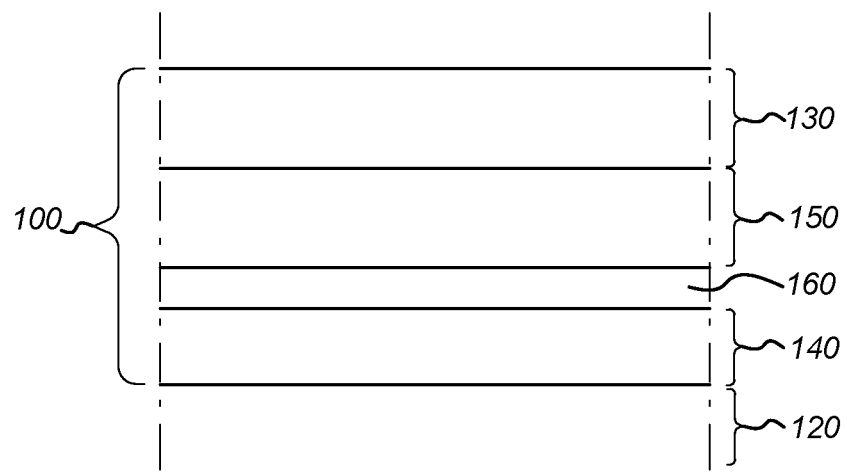
FIG. 1 schematically shows an embodiment of a continuous layer stack according to the present invention.

FIG. 1 schematically shows an embodiment of a continuous layer stack 100 according to the present invention. From the continuous layer stack 100 an array of interconnected solar cells is to be manufactured, ideally through a scalable continuous roll-to-roll process that allows for fast, large area and low cost mass production of up to e.g. 1 gigawatt or more on an annual basis.

The continuous layer stack 100 is placed on a substrate 120. The layer stack 100 comprises a top electrode layer 130, a bottom electrode layer 140 adjacent to the substrate. The layer stack 100 has a photo-voltaic active layer 150 and a barrier layer 160 adjacent to the bottom electrode layer 140 interposed between the top electrode layer 130 and the bottom electrode layer 140.

The substrate 120 can be a rigid (e.g. glass) or a flexible substrate. The substrate 120 can be transparent or opaque. The top electrode layer 130 can comprise a stack of a $ZnO_2Al$ layer and a $ZnO_2$ layer. A junction layer of CdS (Cadmium sulfide) may be used between the photo-voltaic active layer 150 and the top electrode layer 130, the $ZnO_2$ layer is adjacent to the CdS layer, and the $ZnO_2Al$ layer is adjacent to the $ZnO_2$ layer.

The substrate 120 may initially be supplied on a roll as a thin, pliable and possibly transparent foil. The substrate 120 may then be subjected through a high speed manufacturing process for depositing the continuous layer stack 100 onto the substrate 120. The manufacturing process may take place in atmospheric conditions and does not require a vacuum.

The photo-voltaic active layer 150 comprises a CIGS (Copper indium gallium (di)selenide) layer. Alternatively, the photo-voltaic active layer 150 comprises perovskites. Alternatively, the photo-voltaic active layer 150 comprises a combination of a CIGS layer and perovskites.

The bottom electrode layer 140 comprises a Molybdenum layer. The barrier layer 160 comprises a $MoSe_2$ layer. The $MoSe_2$ layer forms an interface layer between the bottom electrode layer 140 and the photo-voltaic active layer 150.

Figure 2:
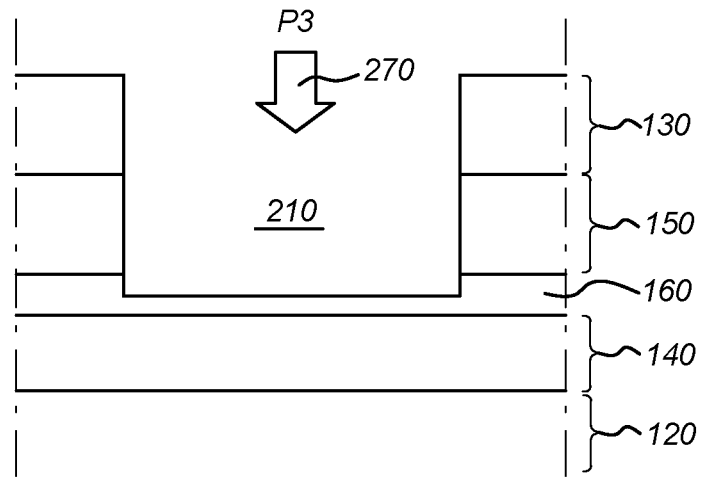
FIG. 2 schematically shows an embodiment of a first scribe according to the present invention.

FIG. 2 schematically shows an embodiment of a first scribe P3 according to the present invention. A first trench 210 is obtained by selectively removing the top electrode layer 130 and the photo-voltaic layer 150, thus exposing the barrier layer 160. This is done by using a first laser beam 270 with a first wavelength from a first laser.

According to the invention, the first wavelength is within a range between 1 µm and 3 µm. A wavelength of approximately 2 µm can be used. The first wavelength is set to be larger than a bandgap energy wavelength of the photo-voltaic layer 150. That is, if the bandgap of the photo-voltaic layer 150 is $E_b = h\,c/\lambda$, wherein h is the Planck's constant, and λ the corresponding wavelength that can be considered as the bandgap energy wavelength, the wavelength of the first laser beam 270 should be larger than the bandgap energy wavelength λ. The first laser beam 270 has a pulsed period within a range between 0.25 ns and 100 ns.

By using the first laser beam 270 that can be a nanosecond pulsed laser beam, the areas of the layer stack 100 that should be kept can easily be preserved. Furthermore, the approach using a 2 µm nanosecond laser beam enables the possibility of creating (optical) structures in the cells that can be used to make translucent modules. Also the creation of shunt-free vias for wrap through approaches can be done using the combination of 2 µm wavelength and 0.532 µm (532 nm) wavelength nanosecond pulsed lasers. The spot size of the 532 nm wavelength laser should be smaller than the spot size of the 2 µm wavelength laser to avoid any absorbance of the 532 nm light on the boundaries of the P3 scribe. For example, a 20 µm green spot of the second laser beam should have a gap with the P3 scribe wall of around 10 µm. A closer distance would generate phase changes in the adjacent CIGS layer.

The barrier layer 160 is a stopping layer preventing the first laser beam 270 reaching the bottom electrode layer 140. The barrier layer 160 can be $MoSe_2$ debris after the laser scribe P3.

Figure 3:
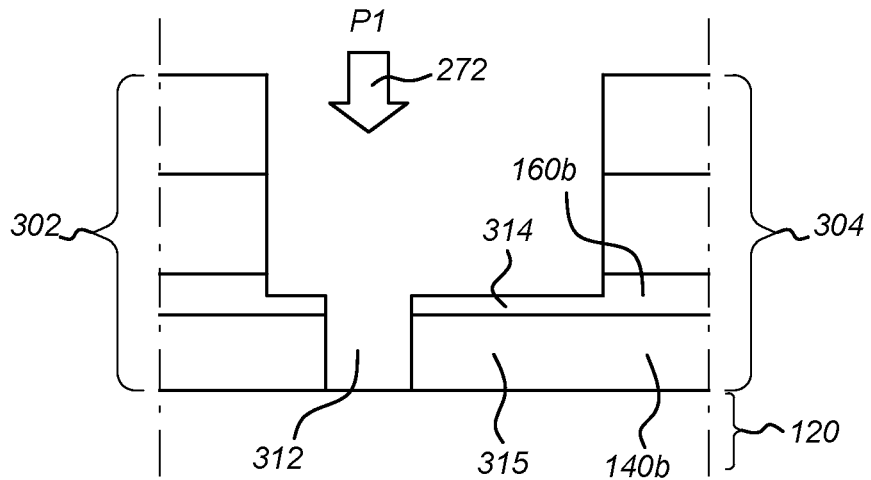
FIG. 3 schematically shows an embodiment of a second scribe according to the present invention.

FIG. 3 schematically shows an embodiment of a second scribe P1 according to the present invention. A second trench 312 is obtained by selectively removing the barrier layer 160 and the bottom electrode layer 140 inside the first trench 210 for exposing the substrate 120. This is done by using a second laser beam 272 with a second wavelength from a second laser. The combination of the second trench 312 and first trench 210 thus provide a separation of the continuous layer stack 100 for forming a first solar cell 302 and a second solar cell 304. The second trench 312 is created inside the first trench 210, and this P1 scribe leaves a portion 314 of the barrier layer 160b of the second solar cell inside the first trench and a portion 315 of the bottom electrode layer 140b of the second solar cell 304 inside the first trench 210. The portion 314 and the portion 315 are stacked on each other and are in the first trench 210 bordering on the second trench 312.

The second wavelength is selected within a range between 0.3 µm and 1.5 µm. A wavelength of 0.532 µm or 1.064 µm (1064 nm) can be used. The smaller wavelength (0.532 µm) is more suitable for creating a thinner scribe. The second laser beam 272 can have a pulsed period within a range between 0.25 ns and 100 ns. By using the second laser beam 272 that can be a nanosecond pulsed laser beam, the areas of the layer stack 100 that should be kept can easily be preserved.

Figure 4:
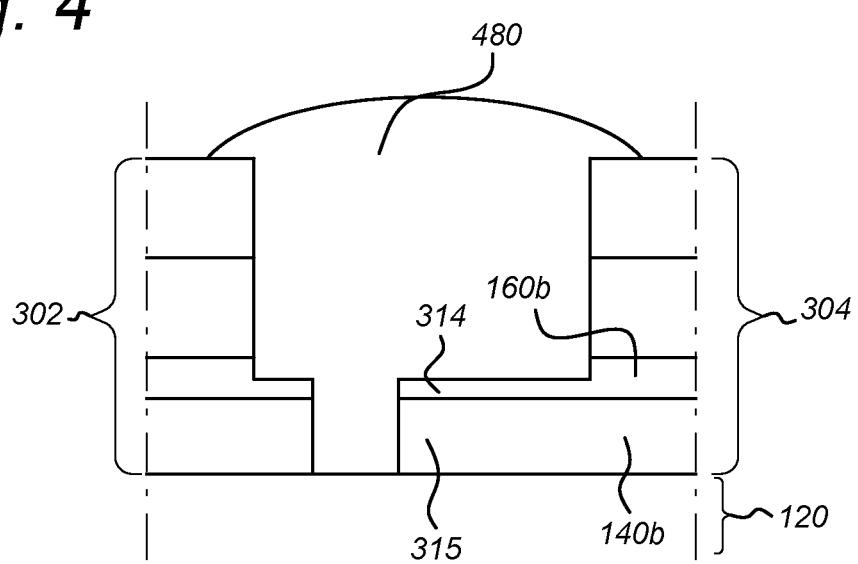
FIG. 4 schematically shows an embodiment of an isolation member according to the present invention.

FIG. 4 schematically shows an embodiment of an isolation member within the first and the second trenches 210, 312 according to the present invention. The first trench 210 and the second trench 312 are filled with an electrical insulating material 480 that forms the isolation member. The electrical insulating material 480 can be an isolating ink. The ink used now is UV curable, but also other mechanisms can be used, for example by a thermal mechanism (e.g. using a laser or an infra-red beam).

Figure 5:
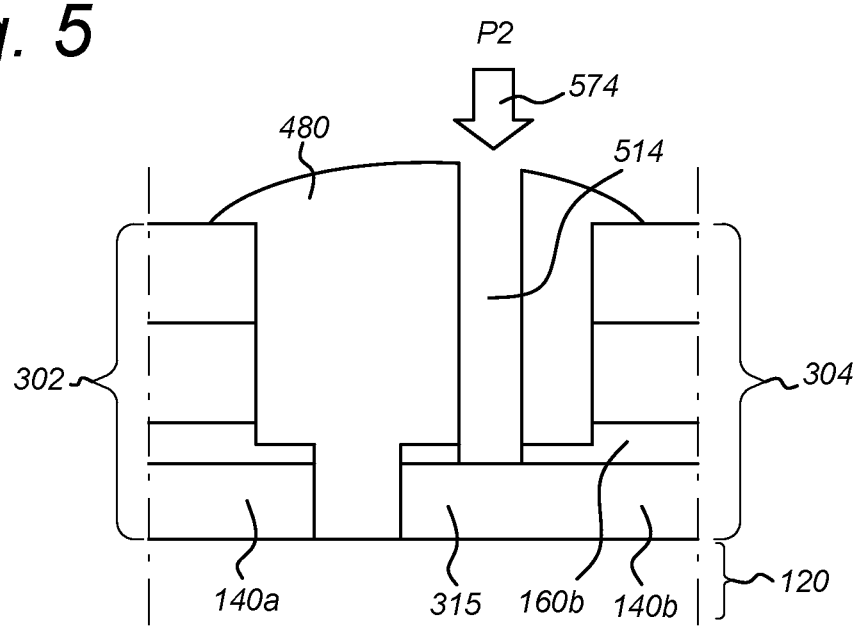
FIG. 5 schematically shows an embodiment of a third scribe according to the present invention.

FIG. 5 schematically shows an embodiment of a third scribe P2 according to the present invention. A third trench 514 is obtained by selectively removing the electrical insulating material 514 and the portion 314 of the barrier layer 160b of the second solar cell 304 inside the first trench 210. The third trench 514 exposes the portion 315 of the bottom electrode layer 140b of the second solar cell 304 inside the first trench 210. This is done by using a third laser beam 574 with a third wavelength from a third laser.

The third wavelength is within a range between 0.3 µm and 1.5 µm. A wavelength of 1.064 µm can be used. The third laser beam 574 can have a pulsed period within a range between 0.25 ns and 100 ns. The second wavelength can be identical with the third wavelength. Moreover, the second laser beam 272 is identical with the third laser beam 574. The second laser generating the second laser beam 272 can be of the same or similar specifications as the third laser generating the third laser beam 574. In practice, the second laser can be identical to the third laser.

Figure 6:
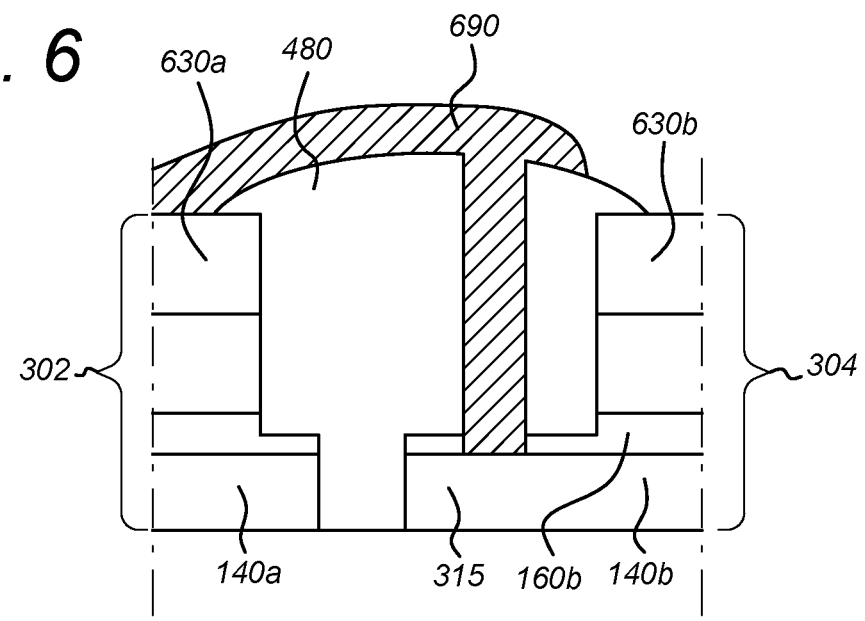
FIG. 6 schematically shows an embodiment of an interconnecting member according to the present invention.

FIG. 6 schematically shows an embodiment of an interconnecting member according to the present invention. An electrical interconnecting member 690 is deposited covering at least a part of the third trench 514 and connecting the top electrode layer 630a of the first solar cell 302 with the portion 315 of the bottom electrode layer 140b of the second solar cell 304 inside the first trench 210. The electrical interconnecting member 690 can be a transparent conductive oxide layer or a metal layer based on a metal containing ink or paste or dispersion manufactured by a printer or by using a printing technique. The transparent conductive oxide layer reduces the dead zone. The interconnected solar cells can be considered as an interconnected solar cell arrangement.

Advantageously, by applying the invention, the areas of the layer stack 100 to contact the interconnecting member 690 that should be kept can easily be preserved by the use of nanosecond pulsed laser beams. Furthermore, the combined use of a 2 µm nanosecond pulsed laser to create a wide P3 scribe and the application of isolating ink, enables the use of other nanosecond pulsed lasers for P1 and P2 scribes. This enables shunt-free interconnections with a reduced dead zone width. By using a 2 µm wavelength laser, debris (MoSe$_2$) is left on the Mo layer in the P3 scribe which actually enables incoupling for the laser to make a clean P2 scribe through the electrical insulating member 480 and the barrier layer 160.

In the foregoing description of the figures, the invention has been described with reference to specific embodiments thereof. It will, however, be evident that various modifications and changes may be made thereto without departing from the scope of the invention as summarized in the attached claims.

In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the appended claims.

In particular, combinations of specific features of various aspects of the invention may be made. An aspect of the invention may be further advantageously enhanced by adding a feature that was described in relation to another aspect of the invention.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:

1. A method of making interconnected solar cells, comprising steps of:
    a) providing a continuous layer stack (100) on a substrate (120), the layer stack comprising a top electrode layer (130), a bottom electrode layer (140) adjacent to the substrate, having a photo-voltaic active layer (150) and a barrier layer (160) adjacent to the bottom electrode layer interposed between the top and the bottom electrode layers;
    b) selectively removing the top electrode layer and the photo-voltaic layer for obtaining a first trench (210) exposing the barrier layer using a first laser beam (270) with a first wavelength;
    c) selectively removing the barrier layer and the bottom electrode layer inside the first trench for obtaining a second trench (312) exposing the substrate using a second laser beam (272) with a second wavelength, wherein the second trench and the first trench provide a separation of the continuous layer stack for forming a first solar cell (302) and a second solar cell (304), and the second trench is inside the first trench leaving a portion (314) of the barrier layer (160b) of the second solar cell inside the first trench and a portion (315) of the bottom electrode layer (140b) of the second solar cell inside the first trench;
    d) filling the first trench and the second trench with an electrical insulating member (480);
    the first wavelength being larger than a wavelength corresponding with a bandgap energy of the photo-voltaic layer,
    wherein the first wavelength is within a range between 1 µm and 3 µm, and
    wherein the barrier layer (160) is a stopping layer preventing the first laser beam (270) reaching the bottom electrode layer (140), the barrier layer (160) comprising a MoSe$_2$ layer that forms an interface layer between the bottom electrode layer and the photo-voltaic active layer,
    the method further comprising:
    e) using a third laser beam (574) with a third wavelength that couples into a portion of the MoSe$_2$ layer to selectively remove the electrical insulating member (480) and the portion (314) of the MoSe$_2$ layer (160b) of the second solar cell (304) inside the first trench (210) from the bottom electrode layer for obtaining a third trench (514) exposing the portion (315) of the bottom electrode layer of the second solar cell inside the first trench;
    f) depositing an electrical interconnecting member (690) covering at least a part of the third trench (514) and connecting the top electrode layer (630a) of the first solar cell (302) with the portion (315) of the bottom electrode layer of the second solar cell inside the first trench,
    wherein each of the second wavelength and the third wavelength is smaller than the first wavelength.

2. The method according to claim 1, wherein the first laser beam is configured to leave a layer of debris containing MoSe$_2$ on the barrier layer while exposing the barrier layer.

3. The method according to claim 1, wherein the first laser beam has a pulsed period within a range between 0.25 ns and 100 ns.

4. The method according to claim 1, wherein the second wavelength is within a range between 0.3 µm and 1.5 µm.

5. The method according to claim 1, wherein the second laser beam has a pulsed period within a range between 0.25 ns and 100 ns.

6. The method according to claim 1, wherein the third wavelength is within a range between 0.3 µm and 1.5 µm.

7. The method according to claim 1, wherein the third laser beam has a pulsed period within a range between 0.25 ns and 100 ns.

8. The method according to claim 2, wherein the second wavelength is identical with the third wavelength.

9. The method according to claim 2, wherein the second laser beam (272) is identical with the third laser beam (574).

10. The method according to claim 1, wherein the top electrode layer (130) comprises a stack of a $ZnO_2Al$ layer and a $ZnO_2$ layer.

11. The method according to claim 10, wherein a CdS layer is placed between the photo-voltaic active layer (150) and the top electrode layer (130), wherein the $ZnO_2$ layer is adjacent to the CdS layer, and the $ZnO_2Al$ layer is adjacent to the $ZnO_2$ layer.

12. The method according to claim 1, wherein the photo-voltaic active layer (150) comprises a CIGS layer.

13. The method according to claim 1, wherein the photo-voltaic active layer (150) comprises perovskites.

14. The method according to claim 1, wherein the bottom electrode layer (140) comprises a Molybdenum layer.

15. The method according to claim 1, wherein the electrical insulating member (480) is an isolating ink.

16. The method according to claim 2, wherein the electrical interconnecting member (690) is a transparent conductive oxide layer, or a metal layer containing ink or paste, or a solidified metal.

17. The method according to claim 1, wherein,
in said step d) of filling the first trench and the second trench with the electrical insulating member (480), an electrical insulating isolating ink is used to fill the first trench and the second trench to form the electrical insulation member (480), and
in said step e) of using the third laser beam (574) with the third wavelength that couples into the portion of the $MoSe_2$ layer to selectively remove the electrical insulating member (480) and the portion (314) of the $MoSe_2$ layer (160*b*) of the second solar cell (304), the third laser beam (574) obtains the third trench (514) exposing the portion (315) of the bottom electrode layer of the second solar cell inside the first trench while not exposing the substrate.

* * * * *